(12) United States Patent
Tsai et al.

(10) Patent No.: US 11,810,846 B2
(45) Date of Patent: Nov. 7, 2023

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Chia-Ching Tsai, Tainan (TW); Yi-Wei Chiu, Kaohsiung (TW); Hung Jui Chang, Shetou Shiang (TW); Li-Te Hsu, Shanhua Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 176 days.

(21) Appl. No.: 17/306,319

(22) Filed: May 3, 2021

(65) Prior Publication Data

US 2021/0257285 A1 Aug. 19, 2021

Related U.S. Application Data

(62) Division of application No. 16/108,535, filed on Aug. 22, 2018, now Pat. No. 10,998,259.

(60) Provisional application No. 62/552,795, filed on Aug. 31, 2017.

(51) Int. Cl.
*H01L 23/498* (2006.01)
*H01L 21/768* (2006.01)

(52) U.S. Cl.
CPC .. *H01L 23/49827* (2013.01); *H01L 21/76816* (2013.01); *H01L 21/76831* (2013.01)

(58) Field of Classification Search
CPC ......... H01L 21/76816; H01L 21/76831; H01L 23/49827
See application file for complete search history.

(56) References Cited

U.S. PATENT DOCUMENTS

| | | | |
|---|---|---|---|
| 6,500,773 B1 | 12/2002 | Gaillard et al. | |
| 7,622,400 B1 | 11/2009 | Fox et al. | |
| 8,465,991 B2 | 6/2013 | Varadarajan et al. | |
| 8,567,110 B2* | 10/2013 | Magalhaes Mendes et al. ........... H01G 9/2077 257/E31.117 | |
| 8,629,058 B2 | 1/2014 | Shue et al. | |
| 10,672,971 B2* | 6/2020 | Brink ..................... G06N 10/00 | |
| 2007/0035026 A1 | 2/2007 | Su et al. | |
| 2010/0164121 A1 | 7/2010 | Feustel et al. | |
| 2011/0117678 A1 | 5/2011 | Varadarajan et al. | |

(Continued)

FOREIGN PATENT DOCUMENTS

| | | |
|---|---|---|
| WO | 2004055881 A1 | 7/2004 |
| WO | 2008094792 A1 | 8/2008 |

*Primary Examiner* — Dale E Page
*Assistant Examiner* — Wilner Jean Baptiste
(74) *Attorney, Agent, or Firm* — Slater Matsil, LLP

(57) ABSTRACT

A dielectric layer is formed over a substrate, an anti-reflective layer is formed over the dielectric layer, and a first hardmask is formed over the anti-reflective layer. A via opening and a trench opening are formed within the dielectric layer using the anti-reflective layer and the first hardmask as masking materials. After the formation of the trench opening and the via opening, the first hardmask is removed. An interconnect is formed within the openings, and the interconnect has a via with a profile angle of between about 70° and about 80° and a depth ratio of between about 65% and about 70%.

20 Claims, 12 Drawing Sheets

(56) References Cited

U.S. PATENT DOCUMENTS

2016/0111324 A1    4/2016   Chiu et al.
2016/0118347 A1    4/2016   Chao et al.

\* cited by examiner

SEMICONDUCTOR DEVICE AND METHOD OF MANUFACTURE

PRIORITY CLAIM AND CROSS-REFERENCE

This application is a division of U.S. patent application Ser. No. 16/108,535 filed on Aug. 22, 2018, entitled "Semiconductor Device and Method of Manufacture," which claims priority to and the benefit of U.S. Provisional Application No. 62/552,795, filed on Aug. 31, 2017, entitled "Semiconductor Device with Trench Profile Method of Manufacture," which applications are hereby incorporated herein by reference in their entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
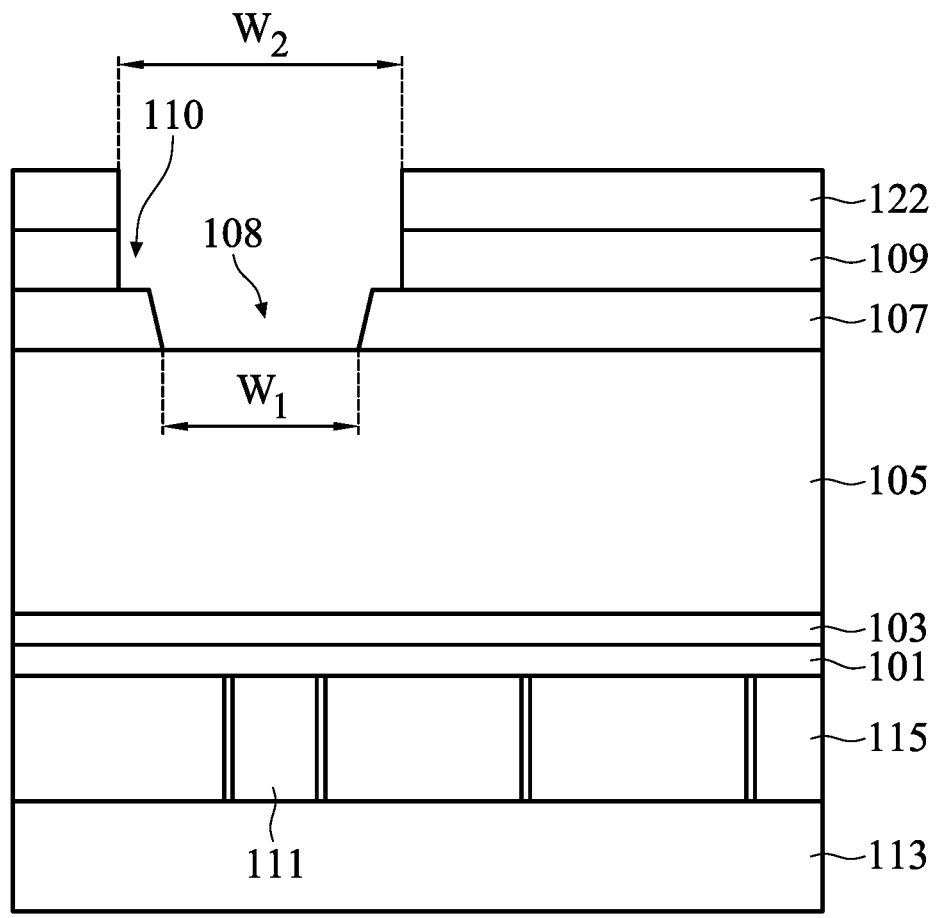
FIGS. 1A-1B illustrate an anti-reflective layer and a first hard mask over a dielectric layer, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1A, there is illustrated a first etch stop layer 101, a second etch stop layer 103, a first dielectric layer 105, an anti-reflective layer 107, and a first hardmask 109 formed over a conductive element 111 (within a metallization layer 115) over a semiconductor substrate 113. In an embodiment the semiconductor substrate 113 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Active devices (not separately illustrated in FIG. 1A) may be formed on the semiconductor substrate 113. In an embodiment the active devices may comprise a wide variety of active devices such as transistors and the like and passive devices such as capacitors, resistors, inductors and the like that may be used to generate the desired structural and functional parts of the design. The active devices and passive devices may be formed using any suitable methods either within or else on the semiconductor substrate 113.

The metallization layers 115 are formed over the semiconductor substrate 113 and the active devices and are designed to connect the various active devices to form functional circuitry for the design. In an embodiment the metallization layers 115 are formed of alternating layers of dielectric and conductive material and may be formed through any suitable process (such as deposition, damascene, dual damascene, etc.). In an embodiment there may be one to twelve layers of metallization separated from the semiconductor substrate 113 by at least one interlayer dielectric layer (ILD), but the precise number of metallization layers is dependent upon the design.

The conductive elements 111 may be formed in an upper portion of the metallization layers 115, and is a region to which an interconnect 701 (not illustrated in FIG. 1A but illustrated and described below with respect to FIG. 7A) will make physical and electrical connection. In an embodiment the conductive elements 111 may be a material such as copper formed using, e.g., a damascene or dual damascene process, whereby an opening is formed within an upper portion of the metallization layers 115, the opening is filled and/or overfilled with a conductive material such as copper, and a planarization process is performed to embed the conductive material within the metallization layers 115. However, any suitable material and any suitable process may be used to form the conductive elements 111.

The first etch stop layer 101 is used to protect the underlying structures and provide a control point for a subsequent etching process through, e.g., the second etch stop layer 103. In one embodiment, the first etch stop layer 101 may be formed of silicon carbon (SiC) using plasma enhanced chemical vapor deposition (PECVD), although other materials such as nitrides, carbides, borides, combinations thereof, or the like, and techniques of forming the first etch stop layer 101, such as low pressure CVD (LPCVD), PVD, or the like, could be used. The first etch stop layer 101 may have a thickness of between about 50 Å and about 2,000 Å, such as about 200 Å.

Once the first etch stop layer 101 has been formed, the second etch stop layer 103 is formed over the first etch stop layer 101. In an embodiment the second etch stop layer 103 is formed of a material such as Al(M*)N, wherein M* represents a metal dopant such as chromium (Cr), aluminum (Al), titanium (Ti), tin (Sn), zinc (Zn), magnesium (Mg), silver (Ag), combinations of these, or the like. The material of the second etch stop layer 103 may be formed using a deposition process such as chemical vapor deposition, physical vapor deposition, atomic layer deposition, or the like, and may be deposited to a thickness of between about 10 Å and about 200 Å, such as about 40 Å. However, any suitable process of formation and thickness may be utilized.

Once the second etch stop layer 103 has been formed, the first dielectric layer 105 may be formed. In an embodiment the first dielectric layer 105 may be, e.g., a low-k dielectric film intended to help isolate the interconnect 701 from other structures. By isolating the interconnect 701, the resistance-capacitance (RC) delay of the interconnect 701 may be reduced, thereby improving the overall efficiency and speed of electricity through the interconnect 701.

Figure 1B:
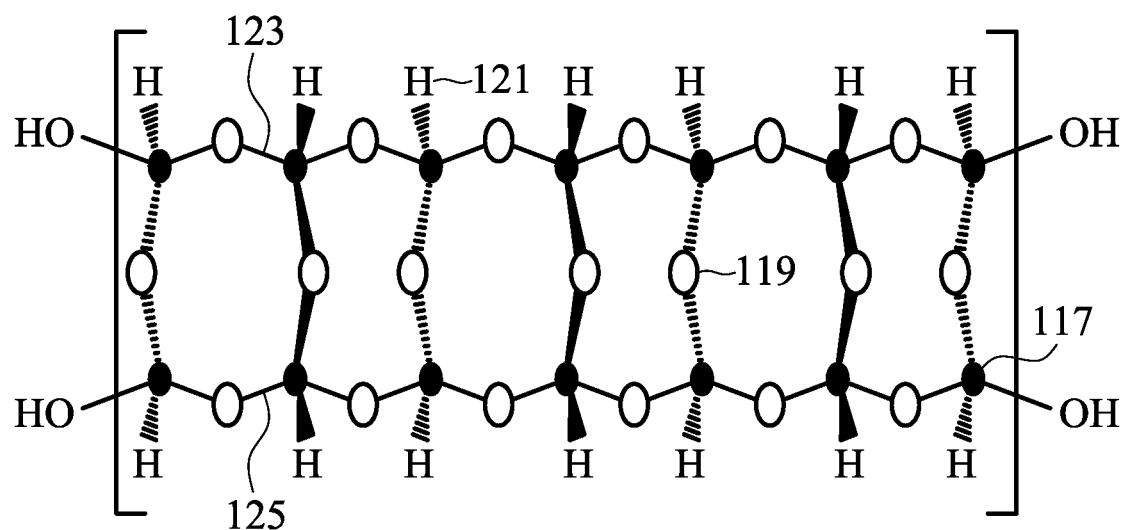

In an embodiment the first dielectric layer 105 may be a non-porous material such as silicon oxide and $C_xH_y$ combined with CO and may be formed over the second etch stop layer 103. FIG. 1B illustrates a close up view of one particular embodiment in which the first dielectric layer 105 comprises a polymer formed from a monomer such as methyldiethoxysilane (mDEOS) as the silicon precursor, a saturated or unsaturated hydrocarbon ($C_xH_y$) such as methane as a $C_xH_y$ precursor, and carbon monoxide as the CO precursor. In this embodiment, as can be seen, the first dielectric layer 105 comprises atoms 117 such as carbon atoms or silicon atoms bonded to oxygen atoms 119 in a repeating pattern along a first linear chain 123 and a second linear chain 125. In FIG. 1B, the atoms 117 illustrated may each be either a carbon atom or a silicon atom, or the atoms 117 may be some combination of the carbon atoms and silicon atoms. Additionally, oxygen atoms 119 also bridge the gap between the first linear chain 123 and the second linear chain 125 to form the material of the first dielectric layer 105.

In the embodiment illustrated in FIG. 1A, the first dielectric layer 105 may be formed using a first precursor in, e.g., a chemical vapor deposition process. In a particular embodiment the first precursor may be mDEOS. However, any suitable precursors may be utilized.

If desired, and in addition to the first precursor, a second precursor may also be utilized in the chemical vapor deposition process. In this embodiment the second precursor may be a $C_xH_y$ precursor such as methane. However, any suitable precursors may be utilized.

Also, in order to incorporate the carbon monoxide within the matrix, a CO precursor may also be utilized. In an embodiment the CO precursor may be a carbon and oxygen containing precursor such as carbon monoxide or the like. However, any suitable precursors that can assist in adding carbon monoxide to the matrix material may be utilized.

To deposit the first dielectric layer 105, the first precursor, the second precursor and the CO precursor are each introduced into a deposition chamber (not separately illustrated) at suitable flow rates. In a particular embodiment the first precursor, the second precursor and the CO precursor may be introduced into the deposition chamber at flow rates in a ratio of 3:2:1, respectively. In other embodiments, the first precursor and the second precursor may be introduced having the same flow rate with each other. Within the deposition chamber, the precursor materials (e.g., the first precursor, the second precursor and the CO precursor) will react at least partially with each other.

Once the precursor materials have been introduced into the reaction chamber, the first precursor (mDEOS), the second precursor, and the CO precursor will react in a plasma assisted reaction in order to deposit the first dielectric layer 105. In an embodiment the first precursor may be ignited into a plasma using, e.g., a transformer coupled plasma generator, an inductively coupled plasma system, a remote plasma generator, or the like in order to prepare the first precursor for the reaction. Once ignited, the plasma of the first precursor will react with the second precursor and the CO precursor to form the first dielectric layer 105 as a non-porous material.

The first dielectric layer 105 may be formed to a thickness sufficient to provide the isolation and routing characteristics that are desired of the first dielectric layer 105. In an embodiment, the first dielectric layer 105 may be formed to a thickness of between about 10 Å and about 1000 Å, such as about 300 Å. However, these thicknesses are meant to be illustrative only, and are not intended to limit the scope of the embodiments, as the precise thickness of the first dielectric layer 105 may be any suitable desired thickness.

In another embodiment the first dielectric layer 105 may be formed as a porous low-k dielectric material. In this embodiment the first precursor (e.g., mDEOS) and the second precursor may be utilized along with a porogen and the CO precursor in order to deposit a precursor layer of material. In an embodiment the porogen may be a molecule that can be removed from the matrix material after the matrix material has set in order to form pores within the matrix and thereby reduce the overall value of the dielectric constant of the first dielectric layer 105. The porogen may be a material that is big enough to form the pores while also remaining small enough such that the size of the individual pores does not overly displace the matrix material. As such, the porogen may comprise an organic molecule such as a methyl containing molecule or an ethyl containing molecule.

To deposit the first dielectric layer 105 in this embodiment, the first precursor, the second precursor, the porogen and the CO precursor are each introduced into a deposition chamber (not separately illustrated) at suitable flow rates. Within the deposition chamber, the precursor materials (e.g., the first precursor, the second precursor, the porogen and the CO precursor) will react at least partially with each other.

Once the precursor materials have been introduced into the reaction chamber, the first precursor (mDEOS), the second precursor, the porogen and the CO precursor will react in a plasma assisted reaction in order to deposit the first dielectric layer 105. In an embodiment the plasma assisted reaction can be performed at a temperature between about 50° C. and about 70° C. and at a pressure of between about 10 mTorr and about 20 mTorr. In an embodiment the first precursor, the second precursor and the porogen may be ignited into a plasma using, e.g., a transformer coupled plasma generator, an inductively coupled plasma system, a remote plasma generator, or the like in order to prepare the first precursor for the reaction. Once ignited, the plasma of the first precursor, the second precursor, and the porogen will react with the CO precursor to form the first dielectric layer 105 as a precursor layer with the porogen incorporated into the precursor layer.

Once the precursor layer has been formed, the porogen is removed from the precursor layer and leaves pores within the first dielectric layer 105. In an embodiment the removal of the porogen is performed by an ultraviolet cure process. For example, the first dielectric layer 105 may be cured for a time of between about 10 s and about 180 s, such as about 90 s. However, any suitable time may be utilized.

By utilizing the process and precursors as described above, the first dielectric layer 105 may be formed with beneficial structural properties. For example, by forming the first dielectric layer 105 as described, the material of the first dielectric layer 105 may be formed to have a K value (with Rs=150 ohm) of greater than about 2.7 (instead of less than 2.7), a hardness of less than 2.1 GPa (instead of greater than 2.1 GPa), a stress of less than about 60 MPa (instead of less than 60 MPa) and has a carbon loss of less than 10% by extreme ultra-violet (instead of greater than 10%).

FIG. 1A additionally illustrates a placement of an anti-reflective layer 107. In an embodiment the anti-reflective layer 107 may be a nitrogen-free anti-reflective coating such as and may comprise a polymer resin, a catalyst, and a cross-linking agent, all of which are placed into a solvent for dispersal. The polymer resin comprises a polymer chain with repeating units, such as a cross-linking monomer and a monomer with chromophore units. In an embodiment the monomer with the chromophore unit may comprise vinyl compounds containing substituted and unsubstituted phenyl, substituted and unsubstituted anthracyl, substituted and unsubstituted phenanthryl, substituted and unsubstituted naphthyl, substituted and unsubstituted heterocyclic rings containing heteroatoms such as oxygen, sulfur, or combinations thereof, such as pyranyl or acridinyl. The substituents in these units may be any hydrocarbyl group and may further contain heteroatoms, such as, oxygen, sulfur or combinations thereof, such as alkylenes, ester, ethers, combinations of these, or the like, with a number of carbon atoms between 1 and 12.

The cross-linking monomer may be used to cross-link the monomer with other polymers within the polymer resin to modify the solubility of the anti-reflective layer 107, and may optionally have an acid labile group. In a particular embodiment the cross-linking monomer may comprise a hydrocarbon chain that also comprises, e.g., a hydroxyl group, a carboxyl acid group, a carboxylic ester group, epoxy groups, urethane groups, amide groups, combinations of the, and the like.

The catalyst may be a compound that is used to generate a chemically active species and initiate a cross-linking reaction between the polymers within the polymer resin and may be, e.g., a thermal acid generator, a photoacid generator, a photobase generator, suitable combinations of these, or the like. In an embodiment in which the catalyst is a thermal acid generator, the catalyst will generate an acid when sufficient heat is applied to the anti-reflective layer 107. Specific examples of the thermal acid generator include butane sulfonic acid, triflic acid, nonaflurobutane sulfonic acid, nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid, combinations of these, or the like.

The cross-linking agent may also be added to the anti-reflective layer 107. The cross-linking agent reacts with the polymers within the polymer resin within the anti-reflective layer 107, assisting in increasing the cross-linking density of the photoresist, which helps to improve the resist pattern and resistance to dry etching. In an embodiment the cross-linking agent may be an melamine based agent, a urea based agent, ethylene urea based agent, propylene urea based agent, glycoluril based agent, an aliphatic cyclic hydrocarbon having a hydroxyl group, a hydroxyalkyl group, or a combination of these, oxygen containing derivatives of the aliphatic cyclic hydrocarbon, glycoluril compounds, etherified amino resins, a polyether polyol, a polyglycidil ether, a vinyl ether, a triazine, combinations of these, or the like.

The materials for the anti-reflective layer 107 may be placed into a solvent for dispersal. In an embodiment the solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Once the material for the anti-reflective layer 107 has been prepared, the material for the anti-reflective layer 107 may be utilized by initially applying the material for the anti-reflective layer 107 onto the first dielectric layer 105. The material for the anti-reflective layer 107 may be applied to the first dielectric layer 105 so that the material for the anti-reflective layer 107 coats an upper exposed surface of the first dielectric layer 105, and may be applied using a process such as a spin-on coating process, a dip coating method, an air-knife coating method, a curtain coating method, a wire-bar coating method, a gravure coating method, a lamination method, an extrusion coating method, combinations of these, or the like. In an embodiment the material for the anti-reflective layer 107 may be applied such that it has a thickness of between about 50 nm and about 500 nm, such as about 450 nm.

Once the anti-reflective layer 107 has been formed, the anti-reflective layer 107 may be patterned to form a first opening 108 and to provide a mask for the formation of a first via opening 205 (not illustrated in FIG. 1A but illustrated and described below with respect to FIG. 2). In an embodiment the anti-reflective layer 107 may be patterned using a photolithographic exposure and development processes or, in an embodiment in which the anti-reflective layer 107 is not photosensitive, a masking and etching process may be utilized to form the first opening 108. In an embodiment the first opening 108 for the first via opening 205 may have a first width $W_1$ of between about 26 nm and about 26.2 nm. However, any suitable dimension may be utilized.

Once the anti-reflective layer 107 has been formed and patterned, the first hardmask 109 may be formed over the anti-reflective layer 107. In an embodiment the first hardmask 109 may be a masking material such as titanium nitride (TiN), although any other suitable material, such as titanium oxide may be used. The first hardmask 109 may be formed using a deposition process such as chemical vapor deposition, physical vapor deposition, atomic layer deposition, combinations of these, or the like, and may be formed to a thickness of between about 50 Å and about 800 Å, such as about 300 Å. However, any suitable thickness may be utilized.

Once formed, the first hardmask 109 may be patterned to form a second opening 110 and in order to provide a masking layer for a subsequent etching process. In an embodiment the first hardmask 109 may be patterned by placing a first photoresist 122 over the first hardmask 109 and then exposing and developing the first photoresist 122 to pattern the first photoresist 122. In an embodiment the first photoresist 122 is a tri-layer photoresist, with a bottom anti-reflective coating (BARC) layer, an intermediate mask layer, and a top photoresist layer (not separately illustrated within FIG. 1A). However, any suitable type of photosensitive material or combination of materials may be utilized. Once the first photoresist 122 has been patterned, the pattern of the first photoresist 122 is then transferred to the first hardmask 109 using, e.g., an anisotropic etching process such as a reactive ion etching process. However, any suitable process may be utilized.

The pattern etched into the first hardmask 109 is a pattern to be used as a mask to form a first trench opening 203 (not illustrated in FIG. 1A but illustrated and described further below with respect to FIG. 2) within the first dielectric layer 105. As such, the opening through the first hardmask 109 has a second width $W_2$ that is larger than the first width $W_1$ of the first opening 108 through the anti-reflective layer 107, such as by being between about 50 nm and about 52 nm. However, any suitable dimensions may be utilized.

Figure 2:
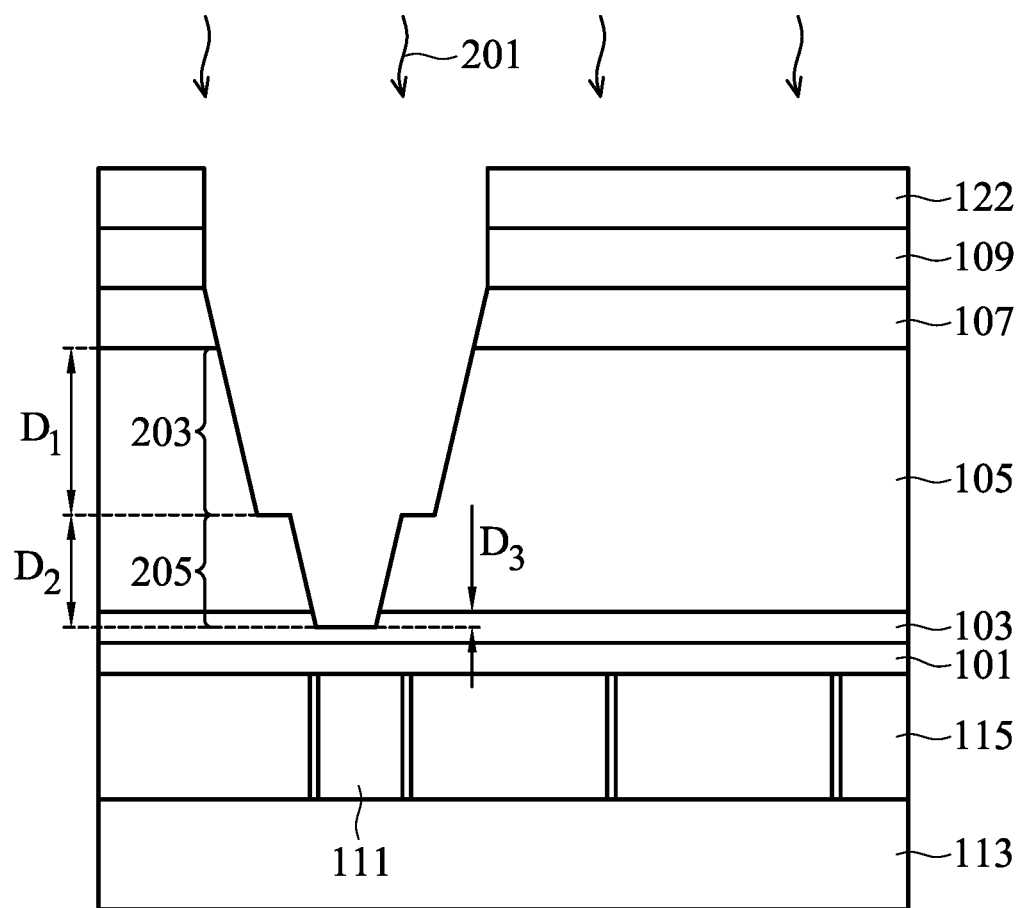
FIG. 2 illustrates a formation of a trench and via, in accordance with some embodiments.

FIG. 2 illustrates that, once the first hardmask 109 has been patterned, the pattern of the first hardmask 109 and the anti-reflective layer 107 may be transferred to the first dielectric layer 105 using a first etching process (represented in FIG. 2 by the arrows labeled 201). In an embodiment the first etching process 201 may be, e.g., an anisotropic etching process such as a reactive ion etch with etchants suitable to etch the first dielectric layer 105 and the anti-reflective layer 107. For example, in an embodiment in which the first dielectric layer 105 is a nitrogen-free anti-reflective coating and the anti-reflective layer 107 is titanium nitride, the first etching process 201 may be an RIE with an etchant such as $CF_4$ and $C_4F_8$. However, any suitable etching method or combination of etching methods, and any suitable etchants, may be utilized.

By using the first etch process 201, the first hardmask 109, and the anti-reflective layer 107 the patterns of both the first hardmask 109 and the anti-reflective layer 107 are transferred to the first dielectric layer 105 and a first trench opening 203 and a first via opening 205 are formed. In particular, the first etching process 201 etches exposed first portions of the first dielectric layer 105 (first exposed by the first opening 108 within the anti-reflective layer 107) and also etches the exposed portions of the anti-reflective layer 107 (first exposed by the second opening 110 within the first hardmask 109). This begins the etching of the via opening 205.

Additionally, as the first etching process 201 continues the first etching process 201 will eventually remove all of the exposed portion of the anti-reflective layer 107 and then begin to etch a second portion of the first dielectric layer 105. This secondary removal of the second portion of the first dielectric layer 105 (that portion which was originally masked by the anti-reflective layer 107 and subsequently exposed by the removal of the anti-reflective layer 107), forms the first trench opening 203. In an embodiment the first etching process 201 may continue until the first trench opening 203 is formed to a first depth $D_1$ of about 45 nm. However, any suitable depth may be utilized.

Additionally, the transfer of the pattern into the first dielectric layer 105 by the first etching process 201 may be continued to extend the first via opening 205 through the first dielectric layer 105, exposing the underlying second etch stop layer 103. In some other embodiments, the transfer of the pattern extends the first via opening 205 at least partially into the underlying second etch stop layer 103. For example, the first etching process 201 may form the first via opening 205 to extend to a second depth $D_2$ of about 43 nm. Further, the first via opening 205 may extend into the second etch stop layer 103 a third depth $D_3$ of about 2 nm. However, any suitable depths may be utilized.

Figure 3:
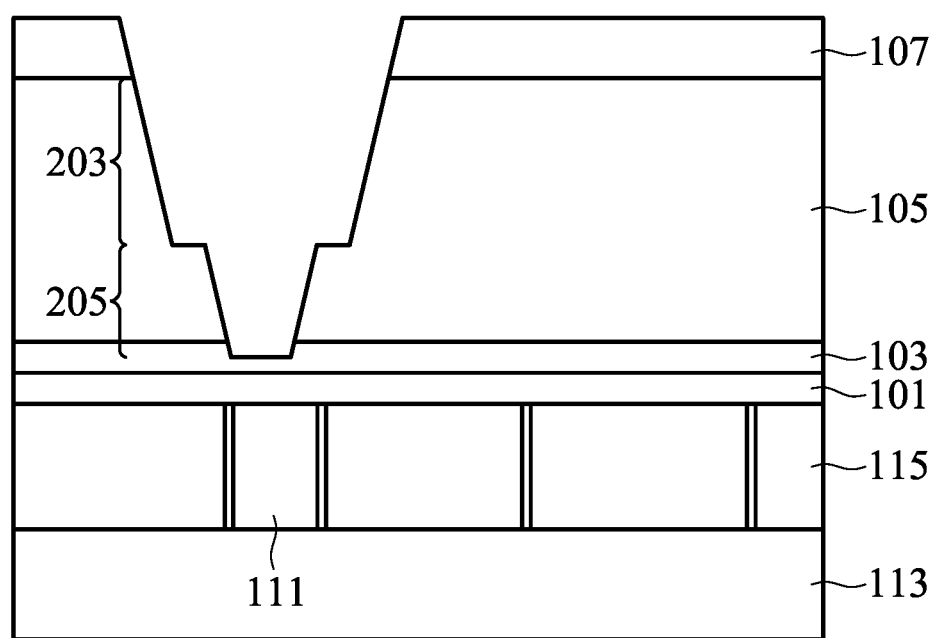
FIG. 3 illustrates a removal of the first hard mask, in accordance with some embodiments.

FIG. 3 illustrates a removal of the first photoresist 122 and the first hardmask 109. In an embodiment, the first photoresist 122 may be removed using, e.g., a plasma ashing process, whereby the temperature of the photoresist may be increased until the first photoresist 122 experiences a thermal decomposition and may be removed which may be followed by an etching process to remove any additional layers of the first photoresist 122 (e.g., a bottom anti-reflective coating (BARC) layer or an intermediate mask layer). However, any other suitable process, such as a wet strip, may be utilized.

Separately or together, the first hardmask 109 may be removed using, e.g., a wet etchant selective to the material of the first hardmask 109. For example, in an embodiment in which the first hardmask 109 comprises titanium nitride, the first hardmask 109 may be removed using a wet etch with a first wet etchant selective to the material of the first hardmask 109. Additionally, the first wet etchant may be applied using a dip process, a spin-on process, a spray-on process, combinations of these, or the like, and may be applied for a time sufficient to remove the first hardmask 109. However, any suitable process parameters or etchants may be utilized for removing the first hardmask 109.

Figure 4:
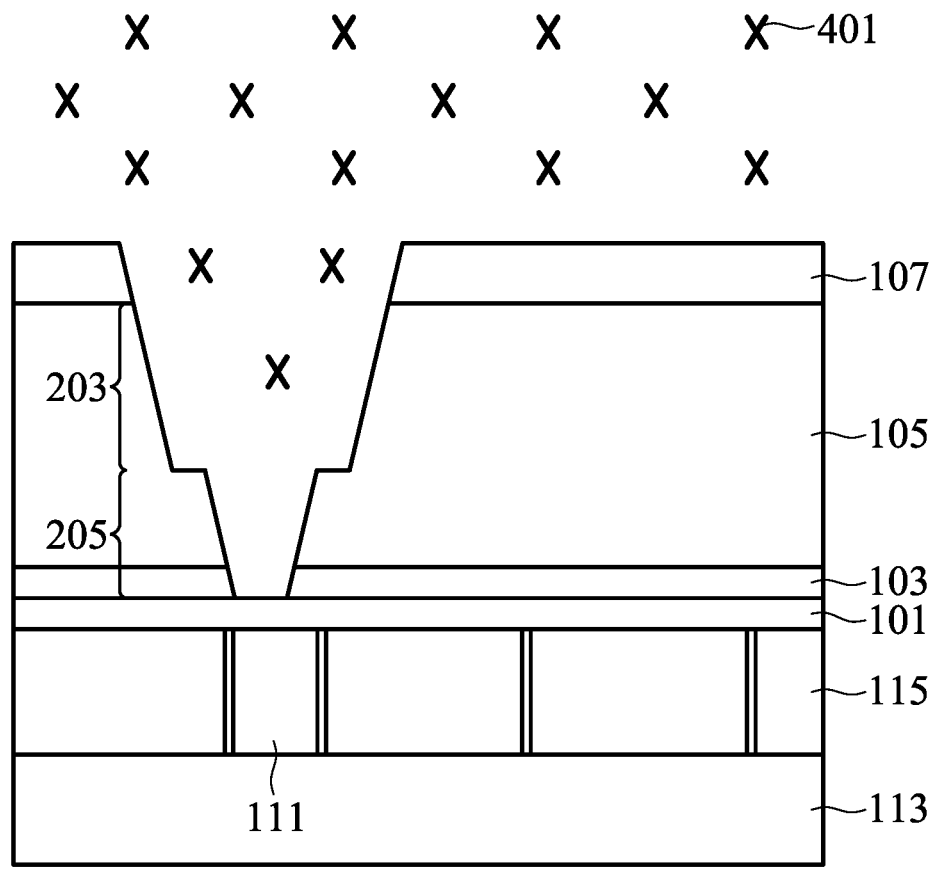
FIG. 4 illustrates a removal of a portion of a second etch stop layer, in accordance with some embodiments.

FIG. 4 illustrates that the first via opening 205 may be extended through the second etch stop layer 103 using a second etching process (represented in FIG. 4 by the Xs labeled 401). In an embodiment the breakthrough of the via openings 205 through the second etch stop layer 103 is performed with one or more wet etching processes in which liquid etchants are brought into contact with the second etch stop layer 103.

For example, in an embodiment in which the second etch stop layer 103 is SiOC, the second etching process 401 may utilize a second wet etchant selective to the material of the second etch stop layer 103 in order to remove a remainder of the second etch stop layer 103. Additionally, the second wet etchant may be applied using a dip process, a spin-on process, a spray-on process, combinations of these, or the like, and may be applied for a time sufficient to remove the second etch stop layer 103. However, any suitable process parameters may be utilized.

Figure 5:
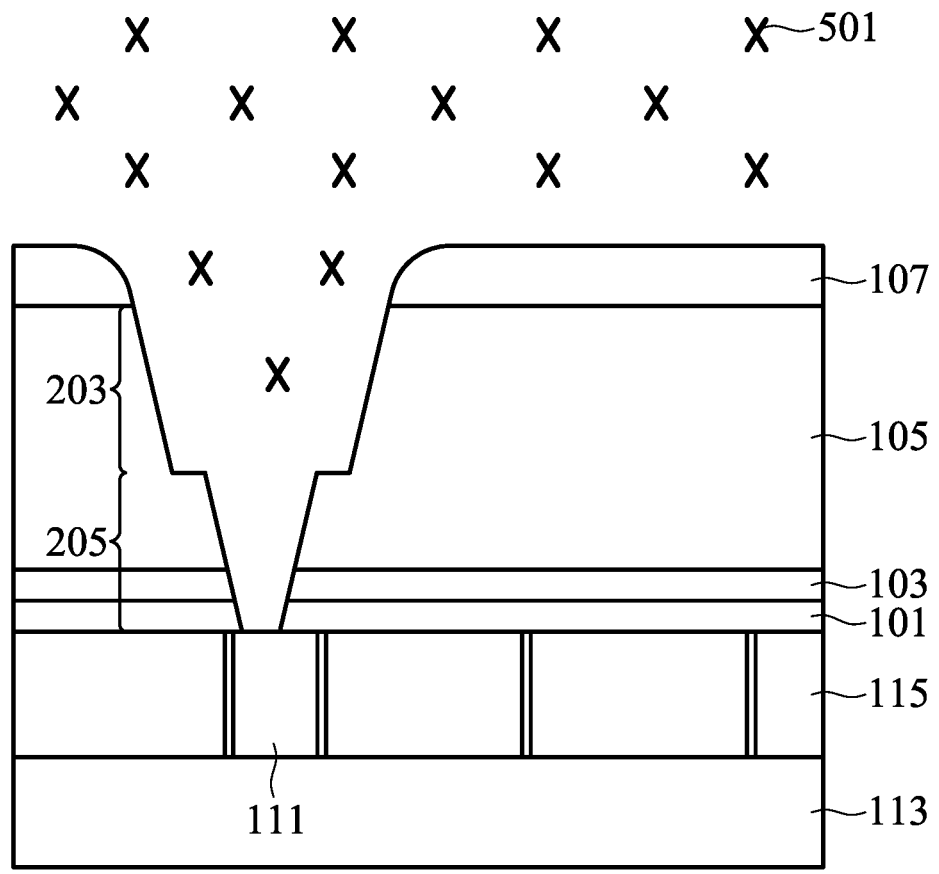
FIG. 5 illustrates a removal of a portion of a first etch stop layer, in accordance with some embodiments.

FIG. 5 illustrates that the first via opening 205 may be extended through the first etch stop layer 101 using a third etching process (represented in FIG. 5 by the Xs labeled 501). In an embodiment the breakthrough of the via openings 205 through the first etch stop layer 101 is performed with one or more wet etching processes in which a third wet etchant is brought into contact with the first etch stop layer 101 through the first via opening 205.

Additionally, by choosing the etchants utilized within the third etching process 501, the same process which extends the via openings 205 through the first etch stop layer 101 (also known as a liner removal) also works to round the corners of the anti-reflective layer 107. For example, in an embodiment in which the first etch stop layer 101 is AlN, the third etching process 501 may utilize a third wet etchant in order to remove a remainder of the first etch stop layer 101. Additionally, the third wet etchant may be applied using a dip process, a spin-on process, a spray-on process, combinations of these, or the like. However, any suitable process parameters may be utilized.

Figure 6:
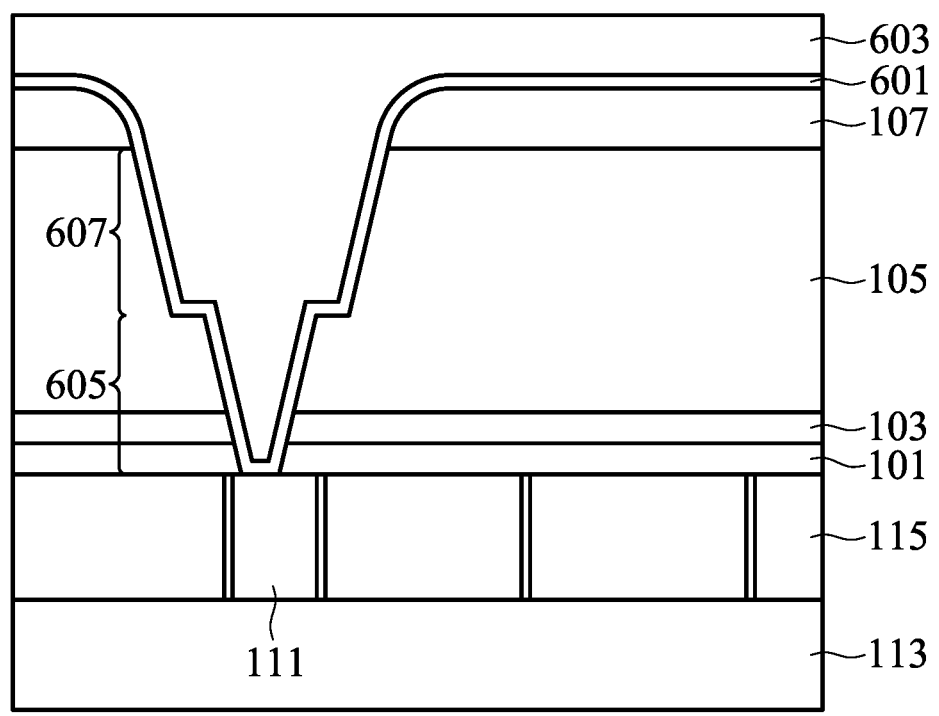
FIG. 6 illustrates a filling with conductive material in accordance with some embodiments.

FIG. 6 illustrates that, once the first via opening 205 and the first trench opening 203 have been formed, a first barrier layer 601 and a conductive material 603 may be deposited to help form the interconnect 701. The first barrier layer 601 layer may be deposited in order to help isolate and protect the subsequently formed conductive material 603 (discussed further below). In an embodiment the first barrier layer 601 may comprise a barrier material such as titanium, titanium nitride, combinations of these, or the like, and may be formed using a process such as chemical vapor deposition (CVD), physical vapor deposition (PVD), atomic layer deposition (ALD), or the like. The first barrier layer 601 may be formed to have a thickness of between about 0.1 μm and about 20 μm, such as about 0.5 μm.

Once the first barrier layer 601 has been formed, the first trench openings 203 and the first via opening 205 are filled with the conductive material 603 to form the interconnect 701 with a via portion 605 (within the first via openings 205; see FIG. 5) and a trench portion 607 (within the first trench opening 203; see FIG. 5). The conductive material 603 may comprise copper, although other suitable materials such as aluminum, alloys, doped polysilicon, combinations thereof, and the like, may be utilized. The conductive material 603 may be formed by depositing a seed layer (not separately illustrated), electroplating copper onto the seed layer, and filling and overfilling the first trench opening 203 and the first via opening 205.

Figure 7A:
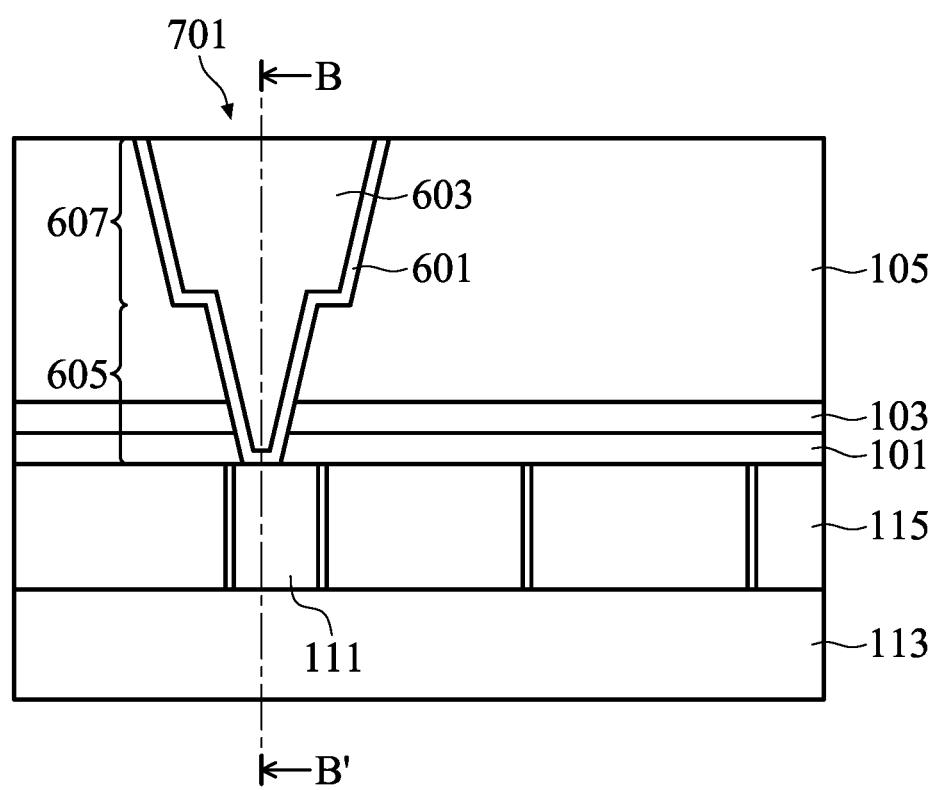
FIGS. 7A-7B illustrate a formation of an interconnect in accordance with some embodiments.
Figure 7B:
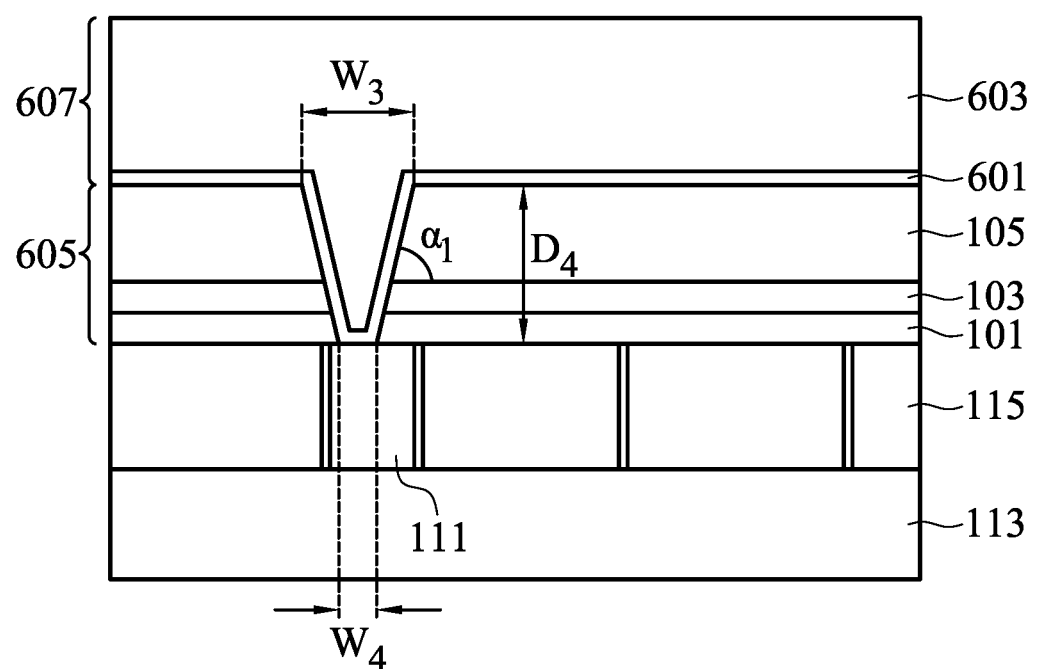

FIGS. 7A-7B illustrate a formation of the interconnect 701, with FIG. 7B illustrating a cross-sectional view of FIG. 7A along line B-B'. Looking first at FIG. 7A, FIG. 7A illustrates that, once the first trench opening 203 and the first via opening 205 have been filled, excess portions of the first barrier layer 601, the seed layer, and the conductive material 603 outside of the first trench opening 203 and the first via opening 205 may be removed through a planarization process such as chemical mechanical polishing (CMP) in order to form the interconnect 701. Additionally, during the planarization process the anti-reflective layer 107 may additionally be removed. However, any suitable removal process may be used.

Looking next at FIG. 7B, in this embodiment, by forming the first trench opening 203 and the first via opening 205 as described above, the trench portion 607 and the via portion 605 have an improved profile which helps to prevent voids from forming during the formation of the conductive material 603 and also helps to reduce the pitch by allowing for more vertical sidewalls. For example, in one embodiment the via portion 605 of the interconnect 701 may have a more vertical sidewall with a first profile angle $\alpha_1$ of between about 70° and about 80°, such as about 75° (instead of 50°-60°).

Additionally, the via portion 605 may have also be formed with a third width $W_3$ (at a top of the via portion 605) of about 64 nm, such as about 64.1 nm and may also have a fourth width $W_4$ (at a bottom of the via portion 605) of about 28 nm, such as about 28.3. As such, a ratio between the third width $W_3$ at the top of via portion 605 (TCD) and the fourth width $W_4$ at the bottom of the via portion 605 (BCD) is between about 1.5 and about 2 (instead of 3.5-4). Similarly, a ratio of the fourth width $W_4$ to the third width $W_3$ is between about 40% and about 45% (instead of 25%-30%). However, any suitable ratios may be utilized. Similarly, the via portion 605 may have a fourth depth $D_4$ of about 43 nm, such as about 43.2 nm. As such, a depth ratio (the fourth depth $D_4$/the third width $W_3$) is between about 65% and about 70% (instead of between about 40%-45%). Such improvements help the interconnect 701 plate without voids, thereby helping the semiconductor device to pass wafer acceptance tests, thereby improving overall yield.

Figure 8:
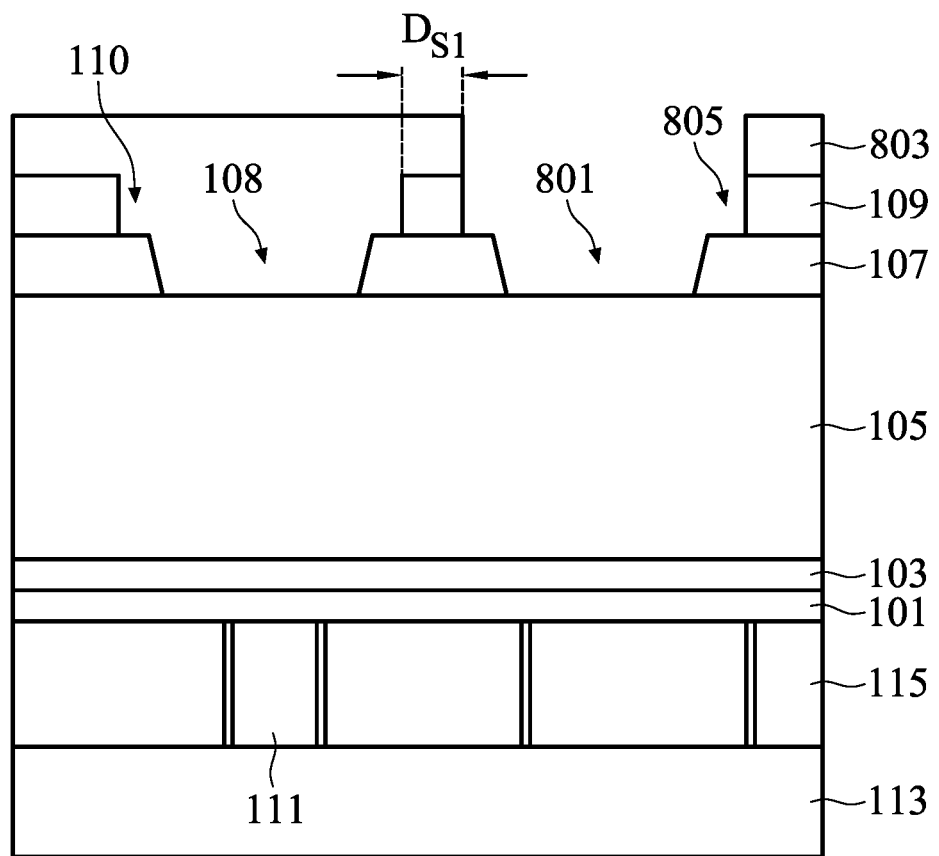
FIG. 8 illustrates a formation of a second opening through the first hardmask layer in accordance with some embodiments.

FIG. 8 illustrates another embodiment in which multiple interconnects 701 are formed within the first dielectric layer 105. In a particular embodiment the process begins as described above with respect to FIG. 1A, wherein the anti-reflective layer 107 is patterned with the first opening 108 and the first hardmask 109 is patterned with the second opening 110 with the use of the first photoresist 122. Additionally in this embodiment, a third opening 801 is formed in the anti-reflective layer 107 either simultaneously or separately from the first opening 108 formed in the anti-reflective layer 107.

Additionally in this embodiment, after the first hard mask 109 has been patterned using the first photoresist 122, the first photoresist 122 (e.g., the tri-layer photoresist) is removed and replaced with a second photoresist 803. In an embodiment, the first photoresist 122 may be removed using, e.g., a plasma ashing process, whereby the temperature of the photoresist may be increased until the first photoresist 122 experiences a thermal decomposition and may be removed, which may be followed by an etching process to remove any additional layers of the first photoresist 122 (e.g., a bottom anti-reflective coating (BARC) layer or an intermediate mask layer). However, any other suitable process may be utilized.

Once the first photoresist 122 has been removed, the second photoresist 803 may be placed and patterned. In an embodiment the second photoresist 803 is a tri-layer photoresist, with a bottom anti-reflective coating (BARC) layer, an intermediate mask layer, and a top photoresist layer (not separately illustrated within FIG. 8). However, any suitable type of photosensitive material or combination of materials may be utilized. Once the second photoresist 803 has been patterned, the pattern of the second photoresist 803 is then transferred to the first hardmask 109 using, e.g., an anisotropic etching process such as a reactive ion etching process to form a fourth opening 805. However, any suitable process may be utilized.

Using multiple photoresists (e.g., the first photoresist 122 and the second photoresist 803), the space between adjacent openings (e.g., the space between the second opening 110 and the fourth opening 805) may be reduced to below the lithographic limitations of a single photoresist. For example, the second opening 110 and the fourth opening 805 may be separated by a first separation distance $D_{S1}$ of about 9 nm. However, any suitable distance may be utilized.

Figure 9:
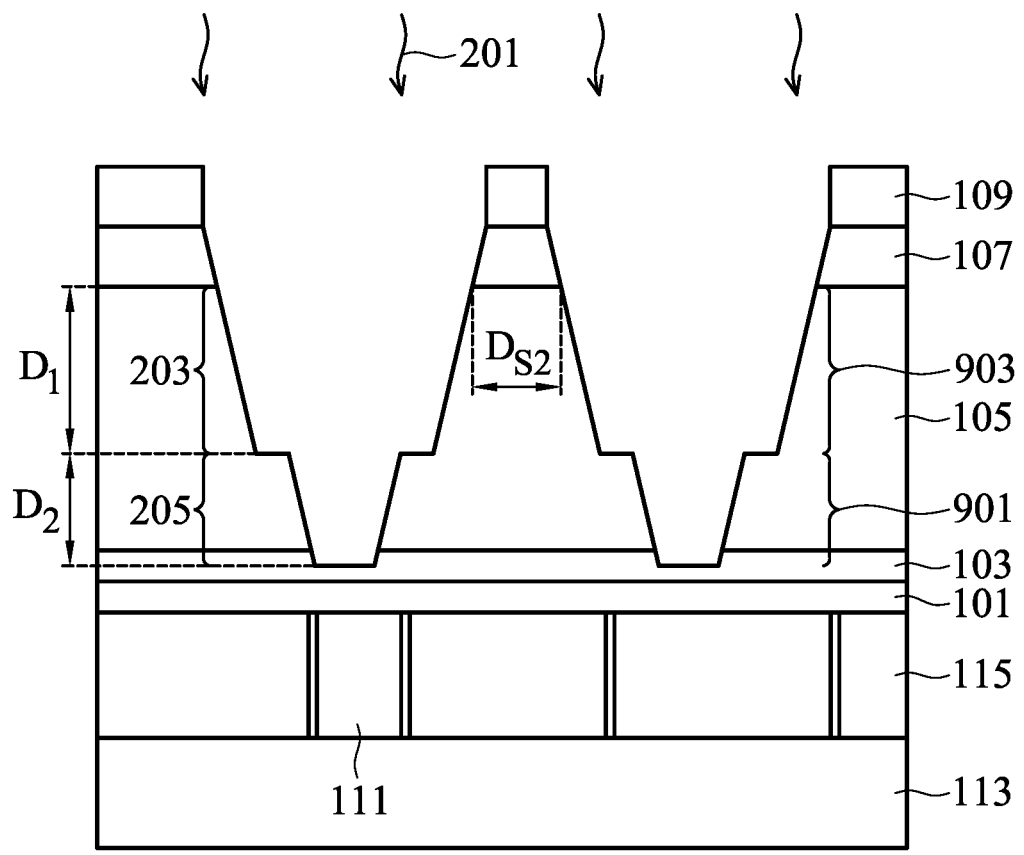
FIG. 9 illustrates a formation of a second via opening and a second trench opening in accordance with some embodiments.

FIG. 9 illustrates that, once the fourth opening 805 has been formed, the second photoresist 803 may be removed and the first etching process 201 may be performed. In an embodiment, the second photoresist 803 may be removed using, e.g., a plasma ashing process, whereby the temperature of the photoresist may be increased until the second photoresist 803 experiences a thermal decomposition and may be removed, which may be followed by an etching process to remove any additional layers of the second photoresist 803 (e.g., a bottom anti-reflective coating (BARC) layer or an intermediate mask layer). However, any other suitable process may be utilized.

Once the second photoresist 803 has been removed, the first etching process 201 may be utilized to form the first via openings 205 as well as the first trench openings 203 (through the first opening 108 and the second opening 110. However, in this embodiment, the first etching process 201 will simultaneously form a second via opening 901 and a second trench opening 903 (through the third opening 801 and the fourth opening 805), thereby also helping to form the second via opening 901 to have the second depth $D_2$ and to form the second trench opening 903 to have the first depth $D_1$. Additionally, the second trench opening 903 may be formed to be separated from the first trench opening 203 by a second separation distance $D_{S2}$ of about 13 nm. However, any suitable dimensions may be utilized.

In an embodiment the first etching process 201 may be performed as described above with respect to FIG. 2. For example, the first etching process 201 may be performed with a reactive ion etch to form the first via opening 205 (along with the second via opening 901 in this embodiment) to extend at least to if not into the second etch stop layer 103.

Figure 10:
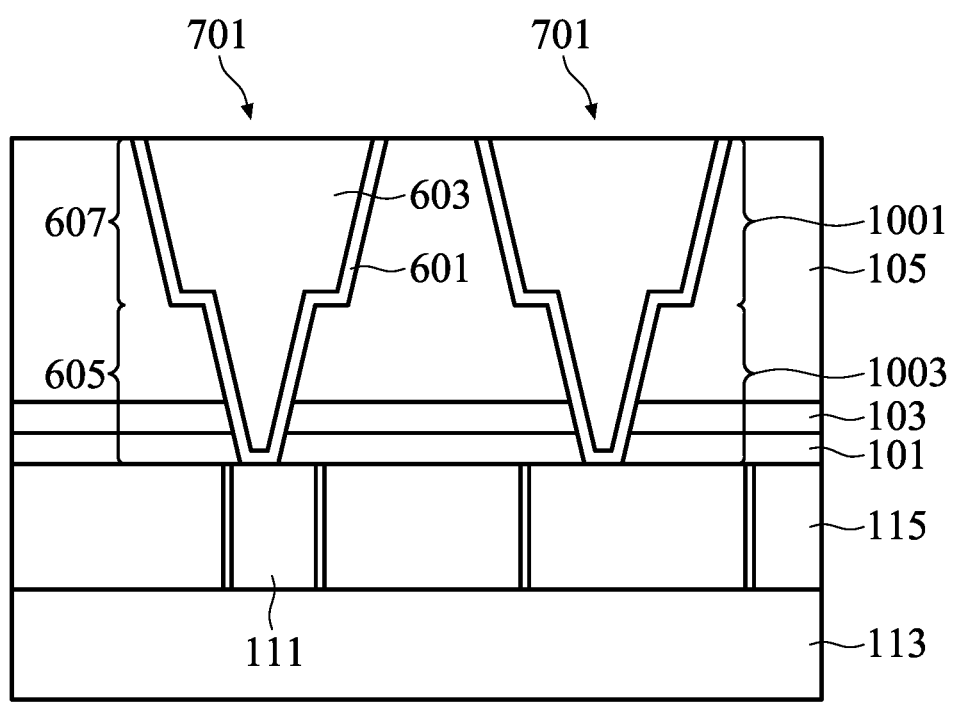
FIG. 10 illustrates a formation of multiple interconnects in accordance with some embodiments.

FIG. 10 illustrates that, once the first etching process 201 has formed the via openings (e.g., the first via opening 205 and the second via opening 901; see FIG. 9) and the trench openings (e.g., the first trench opening 203 and the second trench opening 903; see FIG. 9), the second etching process 401 (as described above with respect to FIG. 4) and the third etching process 501 (as described above with respect to FIG. 5) may be utilized to extend the first via opening 205 and the second via opening 901 through the first etch stop layer 101 and the second etch stop layer 103.

However, as each of these etching processes are performed on each opening at the same time, there is no difference between the etching processes utilized to form the first via opening 205 and the second via opening 901. For example, in other processes, such as partial via etching approach which partially forms one via in a first etching process and partially forms a second via in a second etching process, the separate processes may result in one via having a deeper depth than the other via after the initial etching processes. As such, subsequent etching processes may need to be extended in time (overetching) in order to ensure that the via with the shorter depth still fully exposes the underlying layers.

However, by utilizing the processes described above, the difference in depths between the first via opening 205 and the second via opening 901 is minimal and there is no substantial difference in depths. Further, without this difference in depths, there is no need to account for these differences in depth by utilizing the overetch process. Accordingly, by avoiding the overetching processes, additional damage (such as an unnecessary widening of one via openings because of the overetching processes utilized for a second via openings), a better control of the overall process may be obtained.

FIG. 10 additionally illustrates that, once the first via opening 205 and the second via opening 901 expose the underlying conductive structures, the first barrier layer 601, the seed layer, and the conductive material may be deposited into the first via opening 205, the second via opening 901, the first trench opening 203 and the second trench opening 903. As such, not only are the first via portion 605 and the first trench portion 607 are formed, a second via portion 1003 and a second trench portion 1001. A planarization process may then be used to remove excess material and form multiple interconnects 701.

Additionally, without the need for an overetching process, each of the via openings (e.g., the first via opening 205 and the second via opening 901) and, accordingly, the first via portion 605 and the second via portion 1003 have similar characteristics. For example, both the first via portion 605 and the second via portion 1003 may have the first profile angle $\alpha_1$ of between about 70° and about 80°, such as about 75°, a ratio between the TCD and BCD is between about 1.5 and about 2, a ratio of the fourth width $W_4$ to the third width $W_3$ is between about 40% and about 45%, and a depth ratio of between about 65% and about 70%. As such, even multiple interconnects 701 formed closely spaced to each other can still each receive the benefits of the process.

In an embodiment a method of manufacturing a semiconductor device, the method includes forming a dielectric layer over a first etch stop layer over a conductive feature; forming an anti-reflective layer over the dielectric layer; forming a first hard mask over the anti-reflective layer; patterning the first hard mask to have a first opening larger than a second opening through the anti-reflective layer; forming a first via opening and a first trench opening through the dielectric layer, wherein the forming the first via opening and the first trench opening is performed by etching through both the first opening and the second opening with a single etching process; removing the first hard mask; and removing a portion of the first etch stop layer through the first via opening, wherein after the removing the portion of the first etch stop layer has been stopped the via opening has a first profile angle of between about 70° and about 80°. In an embodiment, the method further includes forming a second via opening and a second trench opening through the dielectric layer with the single etching process. In an embodiment the second trench opening is spaced apart from the first trench opening by a distance of by a distance of about 13 nm. In an embodiment the second via has a second profile angle of between about 70° and about 80°. In an embodiment the removing the portion of the first etch stop layer also rounds a corner of the anti-reflective layer. In an embodiment the first via opening has a depth ratio of between about 65% and about 70%. In an embodiment the method further includes filling the first via opening and the first trench opening with a conductive material.

In an embodiment a method of manufacturing a semiconductor device includes forming a dielectric layer over a first etch stop layer over a substrate, the forming the dielectric layer comprising: introducing a first precursor into a deposition chamber; and introducing carbon monoxide into the deposition chamber; forming an anti-reflective layer over the dielectric layer; forming a first hardmask layer over the anti-reflective layer; patterning a first opening in the first hardmask layer with a first photoresist; patterning a second opening in the first hardmask layer with a second photoresist different from the first photoresist; forming a first via opening through the first opening and a second via opening through the second opening using a single etching process; removing the first hardmask layer; removing a first portion of the first etch stop layer through the first via opening and removing a second portion of the first etch stop layer through the second via opening; and filling the first via opening and the second via opening with a conductive material to form a first via and a second via, wherein the first via has a first profile angle and the second via has the first profile angle. In an embodiment the forming the dielectric layer forms a material with a K value of greater than about 2.7. In an embodiment the forming the dielectric layer forms a material with a hardness of less than 2.1 GPa. In an embodiment the forming the dielectric layer forms a material with a stress of less than about 60 MPa. In an embodiment the forming the dielectric layer forms a material that has a carbon loss of less than 10% by extreme ultra-violet. In an embodiment the first profile angle is between about 70° and about 80°. In an embodiment the first via and the second via each has a depth ratio of between about 65% and about 70%.

In an embodiment semiconductor device includes a dielectric layer over a substrate; a first trench extending at least partially through the dielectric layer; and a first via extending at least partially through the dielectric layer from the first trench, the first via having a first profile angle of between about 70° and about 80°, a first depth ratio of between about 65% and about 70%, and a first ratio of widths between about 1.5 and about 2. In an embodiment the semiconductor device further includes a continuous conductive material extending from a first point within the first via to a second point within the first trench and located over dielectric layer. In an embodiment the semiconductor device further includes a second trench and a second via adjacent to the first trench, the second trench being separated from the first trench by a distance of about 13 nm. In an embodiment the second via has a second profile angle of between about 70° and about 80°. In an embodiment the second via has a second depth ratio of between about 65% and about 70%. In an embodiment the second via has a second ratio of widths between about 1.5 and about 2.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a dielectric layer over a first etch stop layer over a conductive feature;
    forming an anti-reflective layer over the dielectric layer;
    forming a first hard mask over the anti-reflective layer;
    patterning the first hard mask to have a first opening larger than a second opening through the anti-reflective layer;
    forming a first via opening and a first trench opening through the dielectric layer, wherein the forming the first via opening and the first trench opening is performed by etching through both the first opening and the second opening with a single etching process;
    removing the first hard mask; and
    removing a portion of the first etch stop layer through the first via opening, wherein after the removing the portion of the first etch stop layer has been stopped the via opening has a first profile angle of between about 70° and about 80°, wherein the removing the portion of the first etch stop layer also rounds a corner of the anti-reflective layer.

2. The method of claim 1, further comprising forming a second via opening and a second trench opening through the dielectric layer with the single etching process.

3. The method of claim 2, wherein the second trench opening is spaced apart from the first trench opening by a distance of about 13 nm.

4. The method of claim 2, wherein the second via opening has a second profile angle of between about 70° and about 80°.

5. The method of claim 1, wherein the first via opening has a depth ratio of between about 65% and about 70%.

6. The method of claim 1, further comprising filling the first via opening and the first trench opening with a conductive material.

7. A semiconductor device comprising:
    a first via extending upwards from a conductive feature over a substrate, the first via having a first profile angle of between about 70° and about 80°, a first depth ratio of between about 65% and about 70%, and a first ratio of widths between about 1.5 and about 2;
    a first conductive trench extending upwards from the first via; and
    a dielectric layer surrounding the first conductive trench and a portion of the first via, wherein the dielectric layer has a K value of greater than about 2.7.

8. The semiconductor device of claim 7, wherein the dielectric layer has a hardness of less than about 2.1 GPa.

9. The semiconductor device of claim 8, wherein the dielectric layer has a stress of less than about 60 MPa.

10. The semiconductor device of claim 7, further comprising:
    a second via extending upwards from a second conductive feature; and
    a second conductive trench extending upwards from the second via, wherein the dielectric layer surrounds the second conductive trench.

11. The semiconductor device of claim 10, wherein the second conductive trench is spaced apart from the first conductive trench by a distance of about 13 nm.

12. The semiconductor device of claim 10, wherein the second via has a second profile angle of between about 70° and about 80°.

13. A semiconductor device comprising:
    a dielectric layer over a substrate;
    a first trench extending at least partially through the dielectric layer;
    a first via extending at least partially through the dielectric layer from the first trench, the first via having a first profile angle of between about 70° and about 80°, a first depth ratio of between about 65% and about 70%, and a first ratio of widths between about 1.5 and about 2; and
    a continuous conductive material extending from a first point within the first via to a second point within the first trench and located over dielectric layer.

14. The semiconductor device of claim 13, further comprising a second trench and a second via adjacent to the first trench, the second trench being separated from the first trench by a distance of about 13 nm.

15. The semiconductor device of claim 14, wherein the second via has a second profile angle of between about 70° and about 80°.

16. The semiconductor device of claim 15, wherein the second via has a second depth ratio of between about 65% and about 70%.

17. The semiconductor device of claim 16, wherein the second via has a second ratio of widths between about 1.5 and about 2.

18. The semiconductor device of claim 13, wherein the dielectric layer has a K value of greater than about 2.7.

19. The semiconductor device of claim 18, wherein the dielectric layer has a hardness of less than about 2.1 GPa.

20. The semiconductor device of claim 19, wherein the dielectric layer has a stress of less than about 60 MPa.

\* \* \* \* \*